(12) United States Patent
Ooishi

(10) Patent No.: US 6,337,514 B1
(45) Date of Patent: Jan. 8, 2002

(54) SEMICONDUCTOR INTEGRATED CIRCUIT DEVICE EFFECTIVELY DECREASED IN SURFACE STATE REGARDLESS OF NON-PERMEABLE LAYER FOR CHEMICAL SPECIES AGAINST SURFACE STATE AND PROCESS FOR FABRICATING THEREOF

(75) Inventor: Mitsuma Ooishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/210,897

(22) Filed: Dec. 16, 1998

(30) Foreign Application Priority Data

Dec. 19, 1997 (JP) ............................................. 9-350310

(51) Int. Cl.$^7$ ............................................ H01L 27/108
(52) U.S. Cl. ...................... 257/751; 257/754; 257/296; 257/306; 438/477; 438/910
(58) Field of Search ................................. 257/751, 754, 257/314, 202, 306, 210, 211, 296; 438/253, 475, 477, 910

(56) References Cited

U.S. PATENT DOCUMENTS

| 5,248,350 | A | * | 9/1993 | Lee ............................ 148/33.2 |
| 5,250,444 | A | * | 10/1993 | Khan et al. .................... 437/24 |
| 5,600,165 | A | * | 2/1997 | Tsukamoto et al. .......... 257/323 |
| 5,747,830 | A | * | 5/1998 | Okita ............................ 257/72 |
| 5,804,845 | A | * | 9/1998 | Anagnostopoulos et al. ..... 257/231 |
| 5,866,946 | A | * | 2/1999 | Kamigaki et al. ........... 257/751 |
| 5,940,735 | A | * | 8/1999 | Meheta et al. ............... 438/783 |
| 6,066,576 | A | * | 5/2000 | Thakur et al. ............... 438/787 |

FOREIGN PATENT DOCUMENTS

| JP | S58-75866 | 5/1983 |
| JP | 3-102870 | 4/1991 |
| JP | H3-133172 | 6/1991 |
| JP | 4-105359 | 4/1992 |
| JP | H5-110031 | 4/1993 |

OTHER PUBLICATIONS

S. Kimura et al., "A New Stacked Capacitor DRAM Cell Characterized by a Storage Capacitor on a Bit–line Structure", *IEDM 88*, 1988, pp. 596–599.

S. Ito et al., "Limitation of Post–Metallization Annealing Due to Hydrogen Blocking Effect of Multilevel Interconnect", *1998 Symposium on VLSI Technology Digest of Technical Papers*, 1998, pp. 182–183.

* cited by examiner

Primary Examiner—M Wilczewski
(74) Attorney, Agent, or Firm—Sughrue Mion, PLLC

(57) ABSTRACT

A cell plate electrode is shared between storage capacitors of memory cells incorporated in a semiconductor dynamic random access memory device of the type having the storage capacitors over bit lines, and slits are formed in the cell plate electrode in such a manner that the boundaries between channel regions and gate oxide layers are horizontally spaced from the outer periphery of the cell plate electrode and the slits by distances equal to or less than a critical distance determined on the basis of a diffusion length of hydrogen in an inter-level insulating layer, thereby causing the hydrogen to surely reach the boundaries for reducing the density of surface state.

8 Claims, 13 Drawing Sheets

SEMICONDUCTOR INTEGRATED CIRCUIT DEVICE EFFECTIVELY DECREASED IN SURFACE STATE REGARDLESS OF NON-PERMEABLE LAYER FOR CHEMICAL SPECIES AGAINST SURFACE STATE AND PROCESS FOR FABRICATING THEREOF

FIELD OF THE INVENTION

This invention relates to a semiconductor integrated circuit device and, more particularly, to a semiconductor integrated circuit device having a non-permeable layer for a chemical species against the surface state and a process for fabricating the semiconductor integrated circuit device.

DESCRIPTION OF THE RELATED ART

A typical example of the semiconductor dynamic random access memory device is illustrated in FIGS. 1 and 2. The prior art semiconductor dynamic random access memory device is disclosed in IEDM, 1988, pages 596 to 599.

The prior art semiconductor dynamic random access memory device is fabricated on a p-type silicon substrate 1. A field oxide layer 2 is selectively grown on the major surface of the p-type silicon substrate 1, and defines plural active regions 3a/3b. The active regions 3a decline toward the left side, and are arranged at intervals. On the other hand, the active regions 3b decline toward the right side, and are also arranged at intervals. The right end portions of the active regions 3a are alternated with the left end portions of the active regions 3b. Thus, the active regions 3a and the active regions 3b are arranged on the major surface of the p-type silicon substrate in a staggered manner. The active regions 3a/3b form a memory cell array, and the prior art semiconductor dynamic random access memory device includes plural memory cell arrays.

Each of the active regions 3a/3b is assigned to a pair of memory cells, and the memory cell is implemented by a series combination of an n-channel enhancement type access transistor and a storage capacitor. Arsenic is selectively ion implanted into each active region 3a/3b, and two source regions 4a and a common drain region 4b are formed in each active region 3a/3b. The source regions 4a and the common drain region 4b are indicated by hatching lines so as to be easily discriminated from other components.

The surface portion between the source region 4a and the common drain region 4b serves as a channel region, and the channel region is covered with a silicon oxide layer. The silicon oxide layer serves as a gate insulating layer of the n-channel enhancement type access transistor, and word lines 5 extend over the gate insulating layers and the field oxide layer therebetween.

The word lines 5 are covered with a first inter-level insulating layer 6, and bit contact holes 7 are formed in the first inter-level insulating layer 6. The common drain regions 4a are exposed to the bit contact holes 7. The locations of the bit contact holes 7 are represented by oblique lines inserted in boxes in FIG. 1. Bit lines 8 are patterned on the first inter-level insulating layer 6, and are held in contact with the common drain regions 4b through the bit contact holes 7.

The bit lines 8 are covered with a second inter-level insulating layer 9, and node contact holes 10 penetrate through the second inter-level insulating layer 9 and the first inter-level insulating layer 6. The node contact holes 10 are open to the source regions 4a, respectively. The locations of the node contact holes 10 are indicated by "X" inserted in boxes in FIG. 1.

Storage electrodes 11 are formed on the second inter-level insulating layer 9, and are held in contact with the source regions 4a through the node contact holes 10, respectively. The surfaces of the storage electrodes 11 are covered with a dielectric layer 12, and a cell plate electrode 13 is opposed to the storage electrodes 11 through the dielectric layer 12. The cell plate electrode 13 is covered with a third inter-level insulating layer 14, and the third inter-level insulating layer 14 is removed from the layout shown in FIG. 1.

A central area of the major surface is assigned to the memory cell arrays, and peripheral circuits such as decoders and sense amplifiers are assigned a peripheral area around the central area. The cell plate electrode 13 is shared between the memory cells, and occupies over the central area. The cell plate electrode 13 may be separated into cell plate sub-electrodes, which are respectively associated with the memory cell arrays.

The manufacturer has been increasing the memory capacity of the semiconductor dynamic random access memory device, and, accordingly, the cell plate electrode is enlarged. In other words, the cell plate electrode covers the wide central region of the p-type silicon substrate 1.

The n-channel enhancement type access transistors are respectively incorporated in the memory cells of the prior art semiconductor dynamic random access memory device, and the manufacturer is required to decrease the density of surface state during the manufacturing process. The manufacturer carries out a hydrogen annealing after the patterning step for forming the cell plate electrode 13 for decreasing the density of surface state. The hydrogen atoms are coupled with the dangling bonds at the interface between the channel regions and the gate insulating layers, and decreases the density of the surface state.

As described hereinbefore, the wide cell plate electrode 13 covers the central region of the p-type silicon substrate 1, and does not allow the hydrogen atoms to pass therethrough. The cell plate electrode is not a problem in the semiconductor dynamic random access memory device in the previous generations. The central region assigned to the memory cell arrays is not so wide that the hydrogen atoms are diffused from the exposed surface of the semiconductor structure to the channel regions. If the manufacturer carries out the hydrogen annealing before the deposition of polysilicon for the cell plate electrode, the hydrogen surely reaches the boundaries, and decreases the surface state. However, the hydrogen is released from the dangling bonds during a heat treatment after the annealing. For this reason, the hydrogen annealing is carried out after the patterning step for the cell plate electrode.

The decrease of surface state is required for the field effect transistors incorporated in any kind of semiconductor integrated circuit device, and a non-permeable layer like the cell plate electrode is sometimes incorporated in the semiconductor integrated circuit device.

SUMMARY OF THE INVENTION

It is therefore an important object of the present invention to provide a semiconductor integrated circuit device, which allows a chemical species against the surface state to reach a boundary where surface states take place.

It is also an important object of the present invention to provide a process for fabricating the semiconductor integrated circuit device.

The present inventor contemplated the problem, and supposed that the hydrogen atoms would pass a window formed in the cell plate electrode. The present inventor investigated a cell plate electrode formed with a window or the like. The present inventor found a cell plate electrode divided into plural pieces, and the prior art semiconductor dynamic random access memory device with the plural cell plate sub-electrodes was disclosed in Japanese Patent Publication of Unexamined Application No. 3-102870. The purpose of the cell plate electrode divided into the sub-electrodes was reduction of electric charge accumulated therein during a plasma etching for patterning a polysilicon layer into the cell plate electrode. The Fowler-Nordheim tunneling current flew through a dielectric layer thinner than the others due to the accumulated electric charge, and was causative of the time-dependent dielectric breakdown of the thin dielectric layers of the storage capacitors. The amount of the Fowler-Nordheim tunneling current was proportional to the area of the cell plate electrode, and the above-mentioned Japanese Patent Publication of Unexamined Application proposed to divide the cell plate electrode into the plural sub-electrodes. The narrow sub-electrodes reduced the amount of Fowler-Nordheim tunneling current, and prevented the dielectric layers from the time-dependent dielectric breakdown. However, the present inventor noticed that the gaps between the sub-electrodes did not improve the density of surface state at the boundaries between the channel regions and the gate insulating layers of all the access transistors. The present inventor concluded that the location of the windows had important influence on the reduction of the surface density.

In accordance with one aspect of the present invention, there is provided a semiconductor integrated circuit device comprising at least one circuit component having a boundary where surface states take place, an inter-level insulating layer covering the at least one circuit component, and formed of a first material permeable to a chemical species used for reduction of the surface states, and an obstacle layer formed on the inter-level insulating layer over the boundary, formed of a second material less permeable to the chemical species, and having at least one opening providing a passage to the chemical species together with an exposed surface of the inter-level insulating layer outside of an outer periphery of the obstacle and making the boundary spaced from the passage by a distance equal to or less than a critical distance measured in a direction parallel to the obstacle and determined on the basis of a diffusion length of the chemical species under predetermined diffusing conditions.

In accordance with another aspect of the present invention, there is provided a process for fabricating a semiconductor integrated circuit device comprising the steps of a) preparing an intermediate semiconductor structure, b) fabricating at least one circuit component having a boundary where surface states take place, c) covering the at least one circuit component with an inter-level insulating layer formed of a first material permeable to a chemical species used for reduction of the surface states, d) depositing a second material less permeable to the chemical species on the inter-level insulating layer, e) patterning the layer of the second material into an obstacle layer having at least one opening providing a passage to the chemical species together with an exposed surface of the inter-level insulating layer outside of an outer periphery of the obstacle and making the boundary spaced from the passage by a distance equal to or less than a critical distance measured in a direction parallel to the obstacle and determined on the basis of a diffusion length of the chemical species under predetermined diffusing conditions, and f) treating the resultant structure of the step e) with the chemical species under the predetermined diffusing conditions so as to reduce the surface states.

BRIEF DESCRIPTION OF THE DRAWINGS

The features and advantages of the semiconductor dynamic random access memory device and the process will be more clearly understood from the following description taken in conjunction with the accompanying drawings in which.

DESCRIPTION OF THE PREFERRED EMBODIMENTS

First Embodiment

Figure 1:
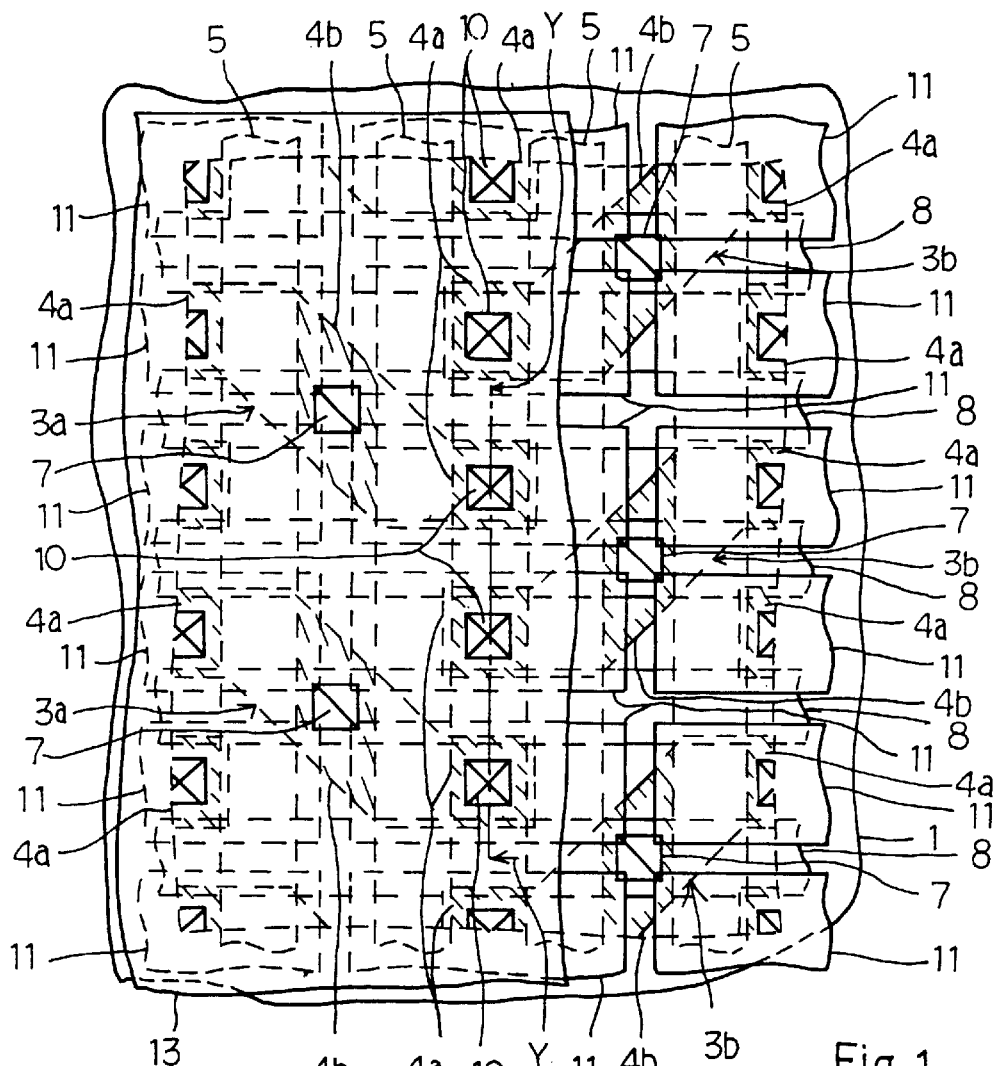
FIG. 1 is a plane view showing the layout of the prior art semiconductor dynamic random access memory device.
Figure 2:
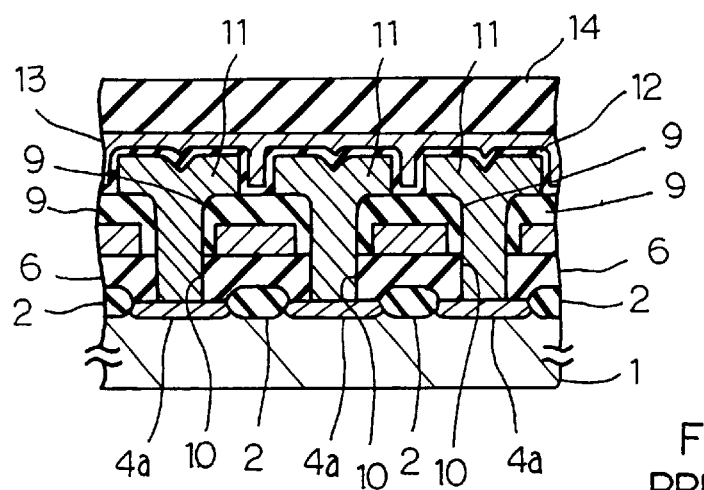
FIG. 2 is a cross sectional view taken along line Y—Y of FIG. 1 and showing the structure of the memory cell incorporated in the prior art semiconductor dynamic random access memory device.

A process embodying the present invention is illustrated in FIGS. 3A to 3E and 4. Layers and regions are stepwise formed into a multi-layered semiconductor structure, and the multi-layered semiconductor structure finally forms a semiconductor dynamic random access memory device. The multi-layered semiconductor structure is so complicated that some references are deleted from the multi-layered semiconductor structure at later stages.

The process starts with preparation of a p-type silicon substrate 21 (see FIG. 3A), and an isolating region 22 is selectively formed on a surface portion of the p-type silicon substrate 21. The isolating region 22 may be implemented by a field oxide layer selectively grown on the surface portion. The isolating region 22 defines plural active regions 23a/23b in the surface portion. A pair of memory cells is assigned to each of the active regions 23a/23b.

The active regions 23a decline toward the left side with respect to an arrow AR1, and are arranged in a direction of arrow AR1 at intervals. The other active regions 23b decline toward the right side with respect the arrow AR1, and are arranged in the direction of arrow AR1 at interval. Both end portions of each active region 23a/23b are bent from the intermediate portion, and are oriented in the direction perpendicular to the arrow AR2.

The right end portions of the active regions 23a are alternated with the left end portions of the active regions 23b, and the right end portion of each active region 23a is spaced from the adjacent left end portions of the active regions 23b by L1 and L2. The length L1 is equal to the minimum gap defined in design rules for the semiconductor dynamic random access memory device. The length L2 is greater than the length L1.

Subsequently, the active regions 23a/23b are thermally oxidized, and gate insulating layers 24 are grown to 10 nanometers thick. Phosphorous-doped polysilicon is deposited over the entire surface of the resultant semiconductor structure by using a low-pressure chemical vapor deposition, and forms a phosphorous-doped polysilicon layer. Photo-resist solution is spread over the phosphorous-doped polysilicon layer, and is baked so that the polysilicon layer is covered with a photo-resist layer (not shown). A pattern image for gate electrode lines is transferred from a photo mask (not shown) to the photo-resist layer, and a latent image is formed in the photo-resist layer. The latent image is developed, and the photo-resist layer is formed into a photo-resist etching mask (not shown). Thus, the photo-resist etching mask is formed through a photo-lithography. Using the photo-resist etching mask, the phosphorous-doped polysilicon layer is selectively etched away by using an anisotropic etching, and the phosphorous-doped polysilicon layer is patterned into gate electrode lines 25. The gate electrode lines 25 extend over the gate insulating layers 24 and the isolating region 22.

Subsequently, arsenic is ion implanted into the active regions 23a/23b in a self-aligned manner with the gate electrode lines 25. The arsenic converts parts of the active regions 23a/23b from the p-conductivity type to n-conductivity type, and forms n-type source regions 26 and n-type common drain regions 27. The n-type source regions 26 and the n-type common drain regions 27 are indicated by hatching lines in FIG. 3B. A part of the gate electrode line 25 on the gate insulating layer 24 serves as a gate electrode, which forms an n-channel enhancement type access transistor of the memory cell together with the gate insulating layer 24, the n-type source region 26 and the n-type common drain region 27.

Subsequently, silicon oxide is deposited to 400 nanometers thick over the entire surface of the resultant semiconductor structure, and forms a first inter-level insulating layer 28. A photo-resist etching mask (not shown) is provided on the first inter-level insulating layer 28 through the photo-lithography, and bit contact holes 29 are formed in the first inter-level insulating layer 28. The common drain regions 27 are exposed to the bit contact holes 29, respectively.

Tungsten silicide is deposited over the entire surface of the resultant semiconductor structure. The tungsten silicide fills the bit contact holes, and forms a tungsten silicide layer. The tungsten silicide is expressed as Wsix where x is abound 2. A photo-resist etching mask (not shown) is formed on the tungsten silicide layer through the photo-lithography, and the tungsten silicide layer is selectively etched so as to be formed into bit lines 30. The bit lines 30 are held in contact with the common drain regions 27 through the bit contact holes 29, and extend in the direction perpendicular to the arrow AR1.

Silicon oxide is deposited to 400 nanometers thick over the entire surface of the resultant semiconductor structure, and forms a second inter-level insulating layer 31. A photo-resist etching mask (not shown) is formed on the second inter-level insulating layer 31 through a photo-lithography, and the second inter-level insulating layer 31 and the first inter-level insulating layer 28 are selectively etched away. As a result, node contact holes 32 penetrate through the second inter-level insulating layer 31 and the first inter-level insulating layer 28, and n-type source regions 26 are exposed to the node contact holes 32, respectively.

Subsequently, polysilicon is deposited over the entire surface of the resultant semiconductor structure. The polysilicon fills the node contact holes 32, and forms a polysilicon layer of 500 nanometers thick. A photo-resist etching mask (not shown) is formed on the polysilicon layer. The photo-resist etching mask exposes the polysilicon layer to etcher except rectangular portions over the n-type source regions 26. The polysilicon layer is patterned into polysilicon rectangular portions, and the rectangular portions are held in contact with the n-type source regions 26 through the node contact holes 32, respectively. The gap between the adjacent polysilicon rectangular portions is equal to the minimum gap L1.

Polysilicon is deposited over the polysilicon rectangular portions, and the thin polysilicon layer is anisotropically etched until the second inter-level insulating layer 31 is exposed. Then, polysilicon side walls are formed from the thin polysilicon layer, and the polysilicon rectangular portion and the polysilicon side wall as a whole constitute a storage electrode 33 (see FIG. 3D). The gap between the adjacent storage electrodes 33 is decreased to value less than the minimum gap L1. Thus, the storage electrodes 33 are arranged at intervals less than the minimum gap L1.

Subsequently, the resultant semiconductor structure is covered with a thin composite dielectric layer 34 (see FIG. 4). The thin composite dielectric layer 34 includes a silicon nitride film and a silicon oxide film, and is as thin as 5 nanometers.

Figure 3A:
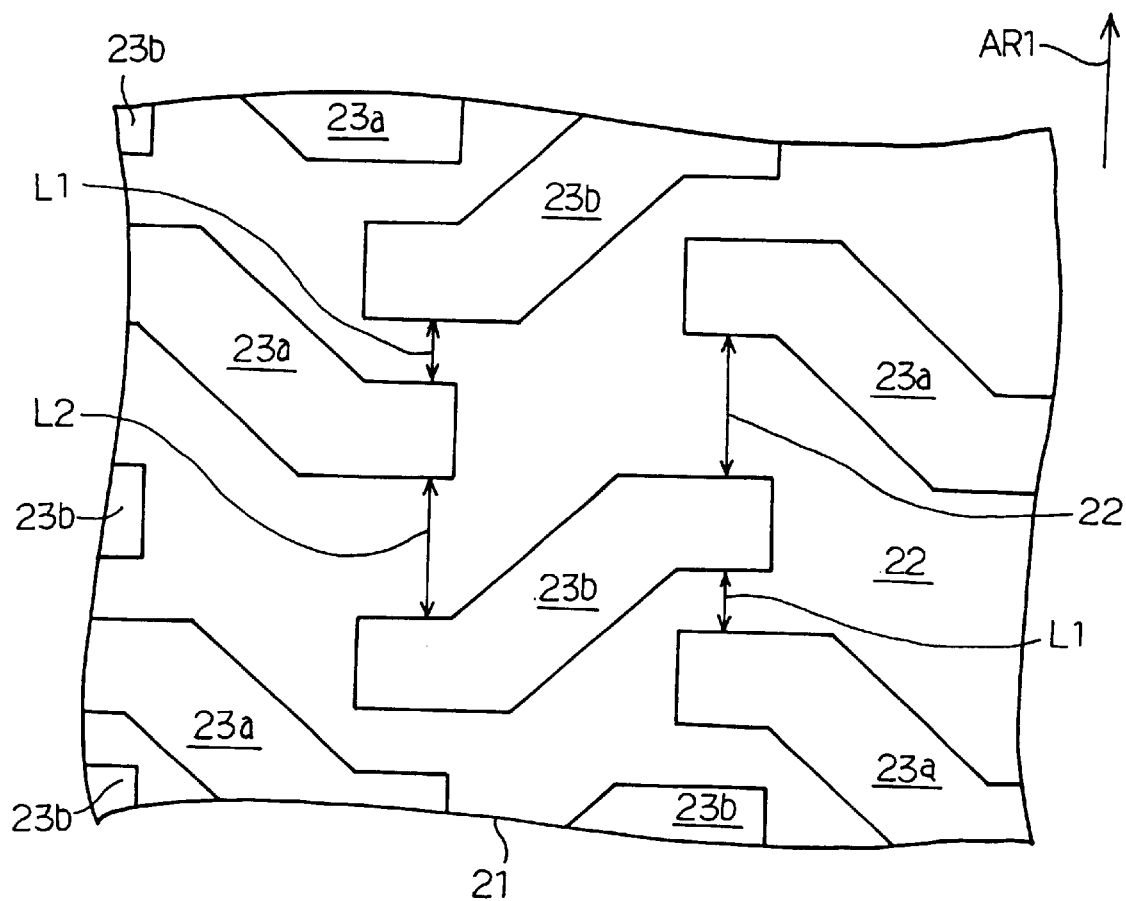
FIGS. 3A to 3E are plane views showing a process for fabricating a semiconductor dynamic random access memory device according to the present invention.
Figure 3B:
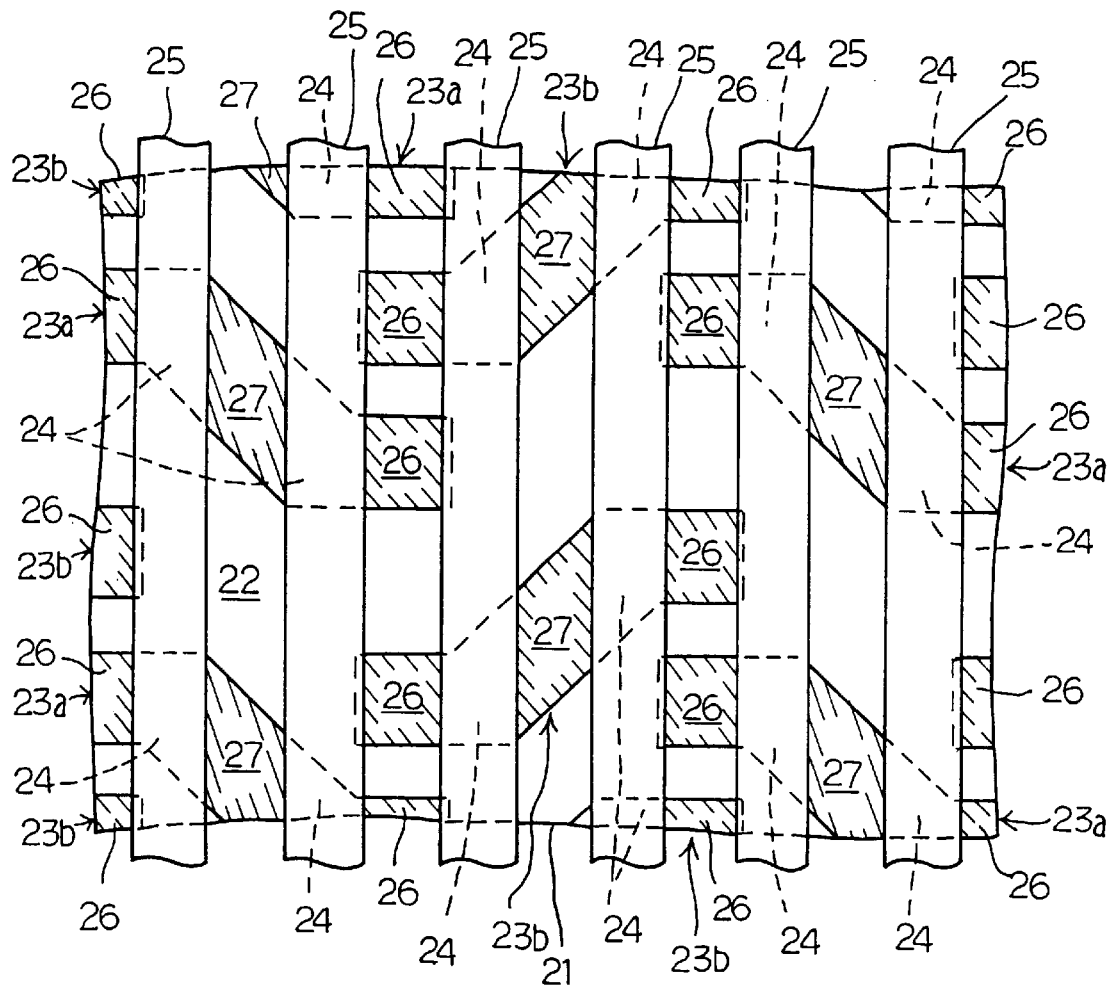
Figure 3C:
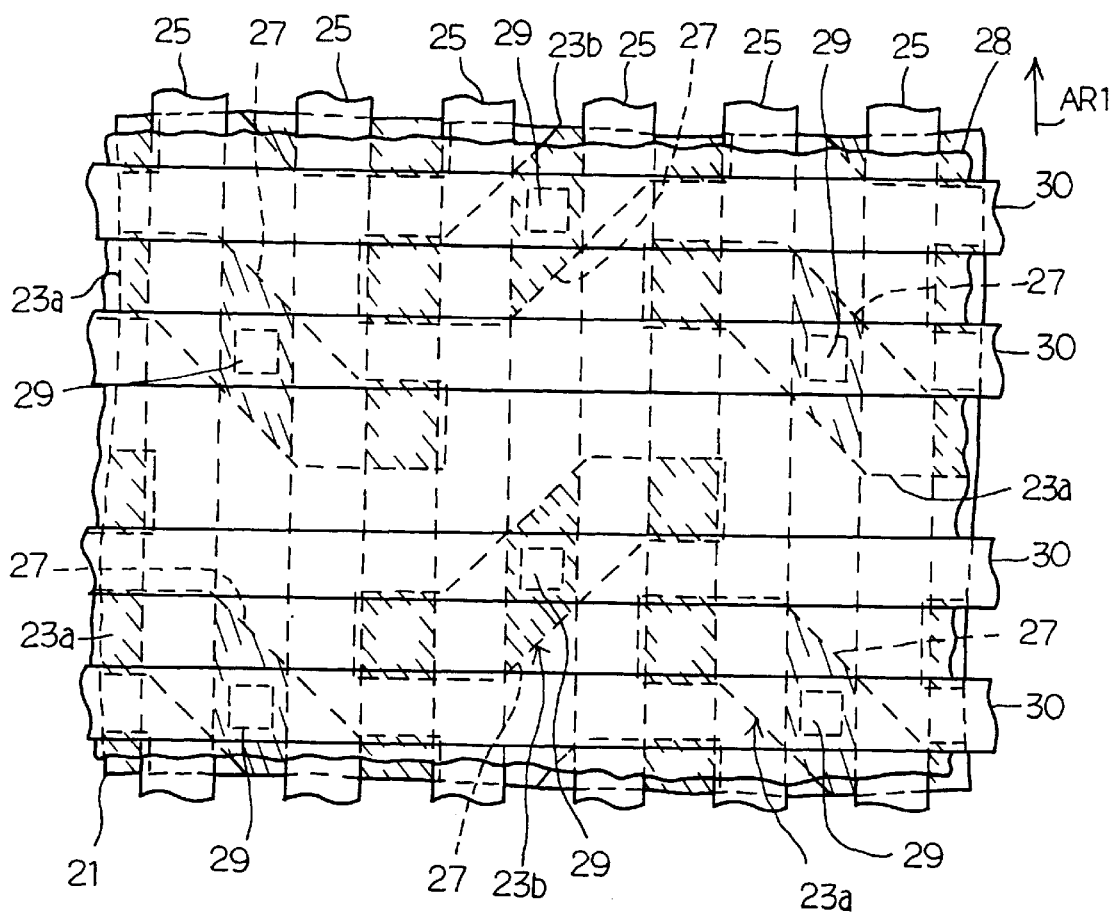
Figure 3D:
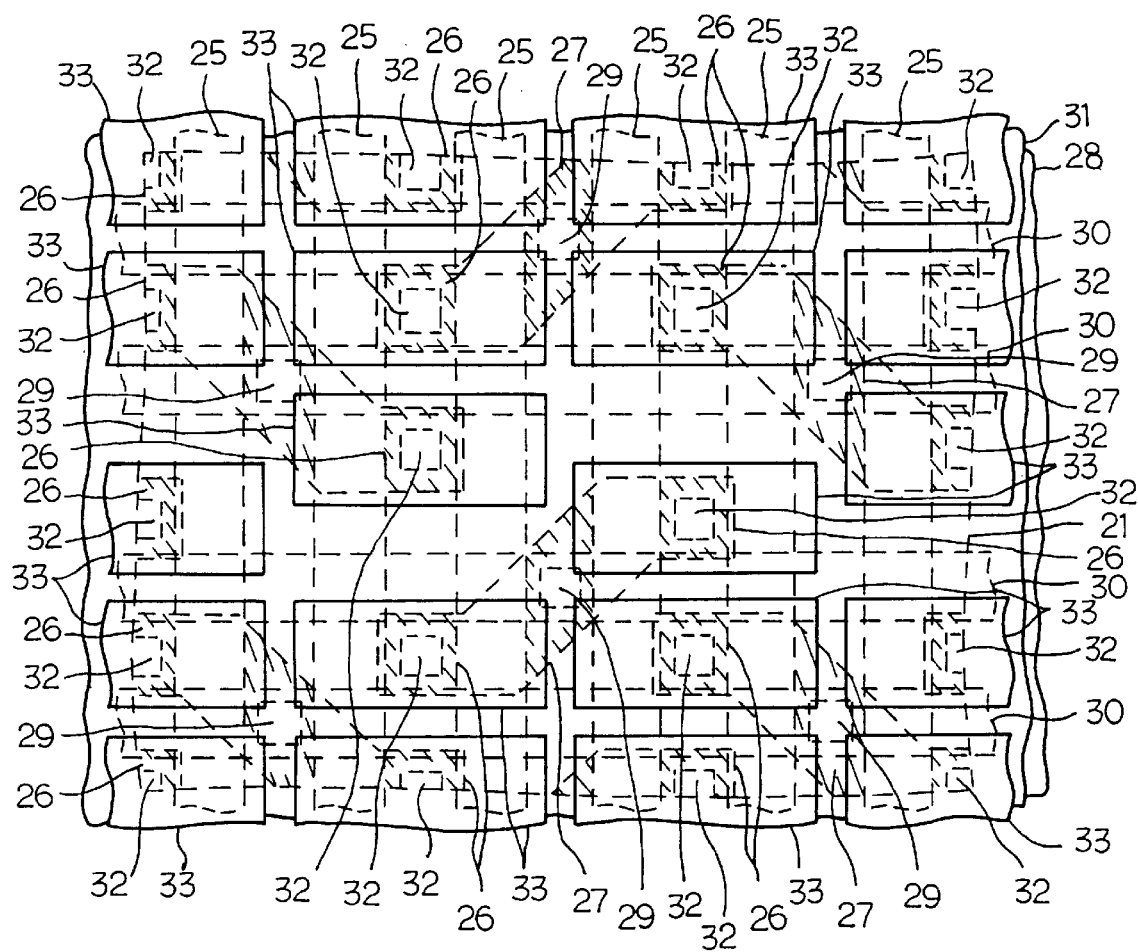
Figure 3E:
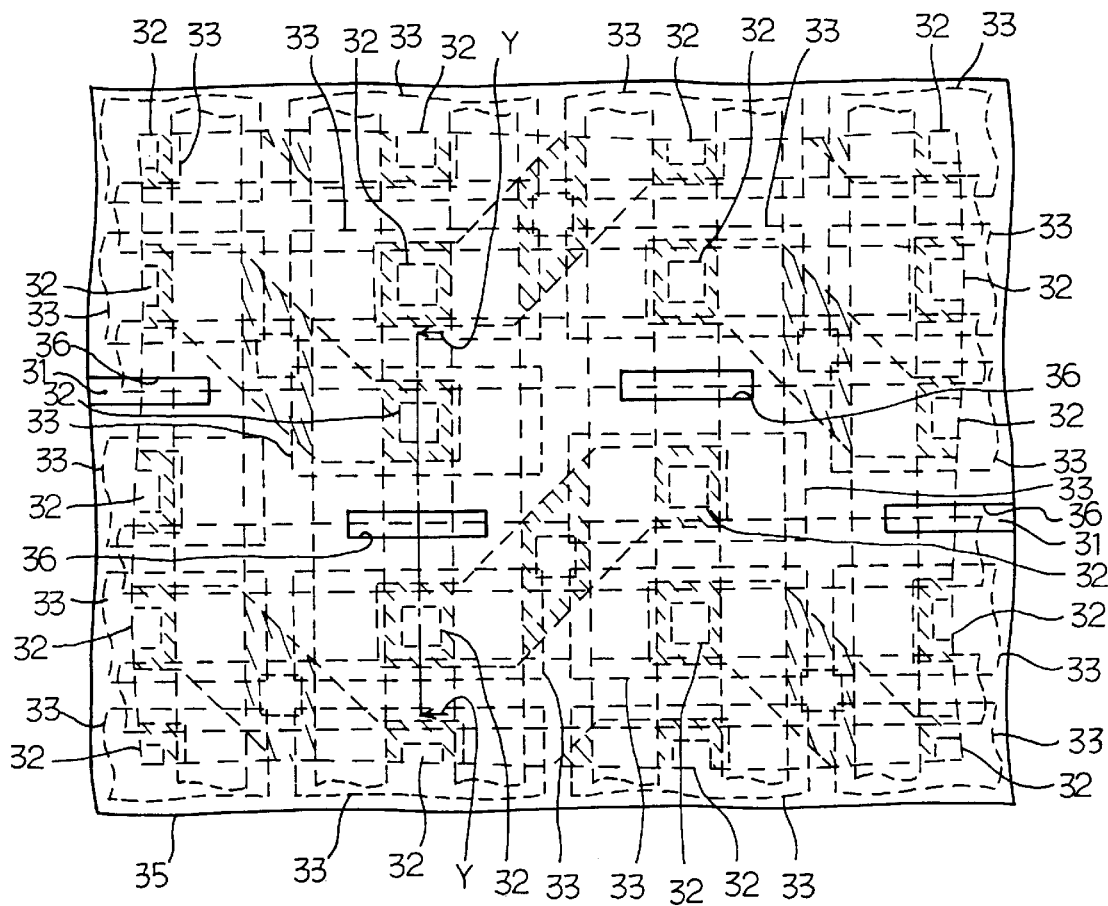

Polysilicon is deposited to 100 nanometers thick over the thin composite dielectric layer 34, and forms a cell plate electrode 35. The cell plate electrode 35 is located over the area assigned to the memory cell array. A photoresist etching mask (not shown) is provided on the polysilicon layer through the photo-lithography. The photo-resist etching mask has slits over the isolating region 22 spacing the right end portion of the active area 23b from the left end portion of the active area 23a by the length L2 (see FIG. 3A). Using the photo-resist etching mask, the polysilicon layer and, thereafter, the thin composite dielectric layer 34 are selectively etched away by using anisotropic dry etching techniques, and slits 36 are formed in the cell plate electrode 35 as shown in FIG. 3E. The slit 36 measures 0.4 micron in width and 2 microns in length. The slits 36 may be formed in the cell plate electrode 35, only. In this instance, the thin composite dielectric layer 34 is exposed to the slits 36. The storage electrode 33, the thin composite dielectric layer 34 and the cell plate electrode 35 as a whole constitute a storage capacitor of each memory cell.

Figure 4:
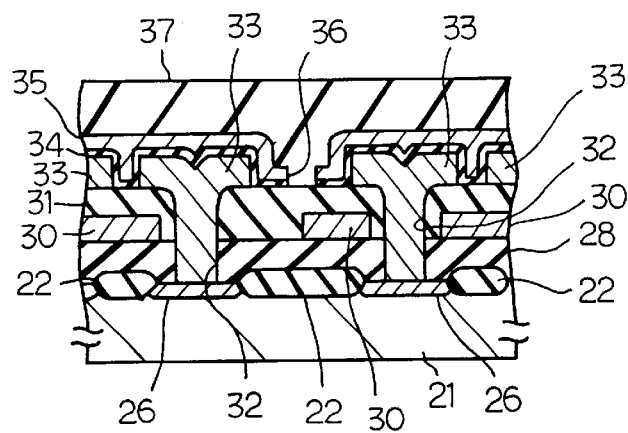
FIG. 4 is a cross sectional view taken along line Y—Y of FIG. 3E and showing the structure of the semiconductor dynamic random access memory device.

Subsequently, boro-phospho-silicate glass is deposited to 400 nanometers thick over the entire surface of the resultant semiconductor structure, and forms a third inter-level insulating layer 37 as shown in FIG. 4.

A photo-resist etching mask is provided on the third inter-level insulating layer 37 through the photo-lithography, and the third inter-level insulating layer 37, the second inter-level insulating layer 31 and the first inter-level insulating layer 28 are selectively etched away so as to form word contact holes (not shown). The word contact holes are arranged at predetermined intervals, and the predetermined interval may be equivalent to 1024 bit lines. Aluminum or aluminum alloy is deposited over the entire surface of the resultant semiconductor structure, and the aluminum layer or the aluminum alloy layer is patterned into main word lines (not shown) by using the photo-lithography and an etching technique. The main word lines are selectively connected through the word contact holes to the gate electrode lines 25, and the main word lines and the gate electrode lines 25 form plural word lines.

Figure 5:
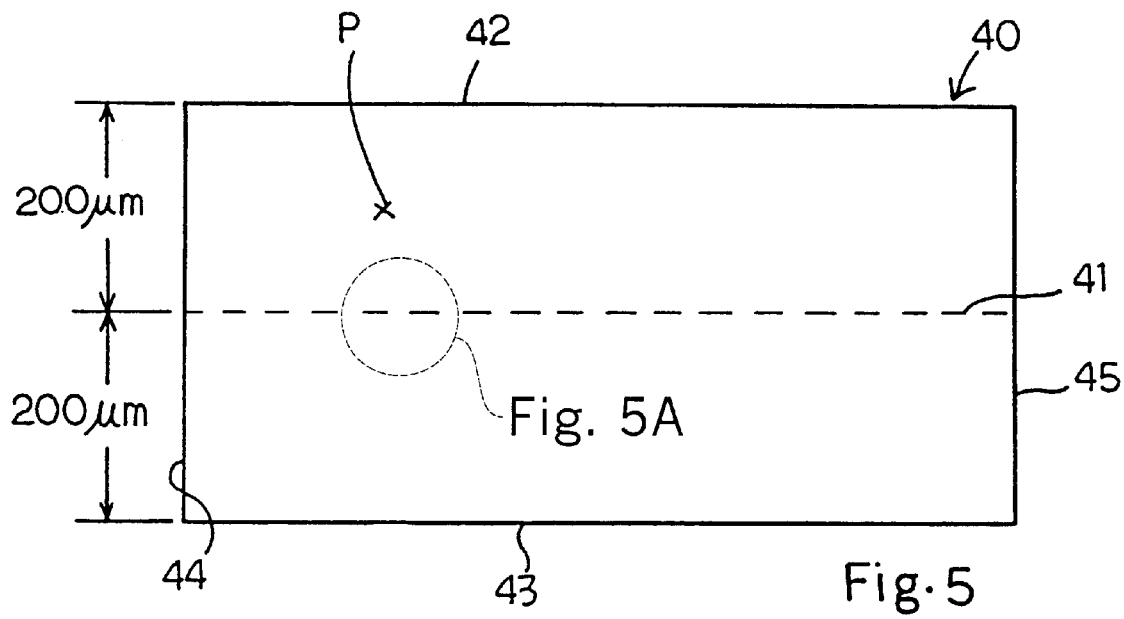
FIG. 5A is a partially enlarged plane view of a cell plate electrode as shown in FIG. 5. The cell plate electrode of FIG. 5 is equivalent to a cell plate electrode incorporated in the semiconductor dynamic random access memory device shown in FIG. 4.
Figure 5A:
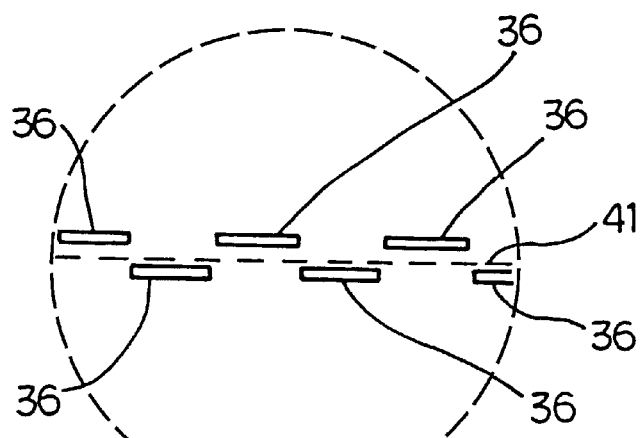

The cell plate electrode 35 is equivalent to a rectangular cell plate electrode 40. The slits 36 are formed on both sides of the center line 41 in a staggered manner (see FIG. 5A). The center line 41 is equally spaced from side edges 42/43, and the distance between the side edge 42/43 and the slits 36 is less than 200 microns (see FIG. 5). For this reason, an arbitrary point P under the rectangular cell plate electrode 40 is spaced from either edge line 42/43/44/45 or slit 36 by distance equal to or less than 100 microns. The slits 36 and the second interlevel insulating layer 31 outside of the periphery of the electrode 40 provide gas passage to a chemical species used for reduction of surface state.

The resultant semiconductor structure is placed in an annealing chamber (not shown), and gaseous mixture of inert gas and hydrogen is introduced into the annealing chamber. The hydrogen gas and the inert gas are regulated to 1:1. The annealing chamber is maintained at the atmospheric pressure, i.e., about $10^5$ Pa, and the hydrogen annealing is carried out at 400 degrees in centigrade for 30 minutes. The hydrogen enters through the slits 36 into the second inter-level insulating layer 31, and is diffused through the second interlevel insulating layer 31 and the first inter-level insulating layer 28. The hydrogen reaches the boundaries between the channel regions and the gate insulating layers 24, and are coupled to the dangling bonds of the p-type silicon crystal. As a result, the surface state is decreased.

The present inventor evaluated the slits 36 as follows. A square active region was defined in a p-type silicon substrate, and was covered with a silicon oxide layer of 10 nanometers thick. The silicon oxide layer was corresponding to the gate insulating layer 24. Conductive stripes were patterned in parallel at intervals of 60 microns, and were 50 microns wide. The conductive stripes extended over the silicon oxide layer. The conductive stripes were as thick as the gate electrode lines 25, and were formed of the same material as them. For this reason, the conductive stripes were corresponding to the gate electrode lines 25. The square active region, the silicon oxide layer and the conductive strips formed plural MOS capacitors.

The plural MOS capacitors were covered with a silicon oxide layer of 400 nanometers thick, which was corresponding to the first inter-level insulating layer 28. Silicon oxide layer was further deposited to 400 nanometers thick, and formed a silicon oxide layer of 400 nanometers thick corresponding to the second inter-level insulating layer 31. On the second silicon oxide layer was patterned a square polysilicon layer, which was located over the square active region. The square polysilicon layer measured 4 mm×4 mm, and was corresponding to the cell plate electrode 35. However, any slit was not formed in the square polysilicon layer. A boro-phospho-silicate glass layer of 400 nanometers thick was laminated on the second silicon oxide layer, and was corresponding to the third inter-level insulating layer 37.

The present inventor carried out the hydrogen annealing under the same conditions as the first embodiment. Hydrogen was mixed with inert gas, and the hydrogen and the inert gas was regulated to 1:1. The annealing chamber was filled with the gaseous mixture at $10^5$ Pa, and the temperature was 400 degrees in centigrade. The hydrogen annealing was continued for 30 minutes.

After the hydrogen annealing, the present inventor measured a quasi static capacitance-to-voltage characteristics of the MOS capacitor, and compared the quasi static capacitance-to-voltage characteristics with theoretical capacitance-to-voltage characteristics. The density of surface state in the vicinity of the center line of the forbidden band of silicon was estimated from the different between the quasi static capacitance-to-voltage characteristics and the theoretical capacitance-to-voltage characteristics. The present inventor plotted the density of surface state in terms of distance from the periphery of the square polysilicon layer in FIG. 6. The distance was measured in parallel to the major surface of the p-type silicon substrate.

Figure 6:
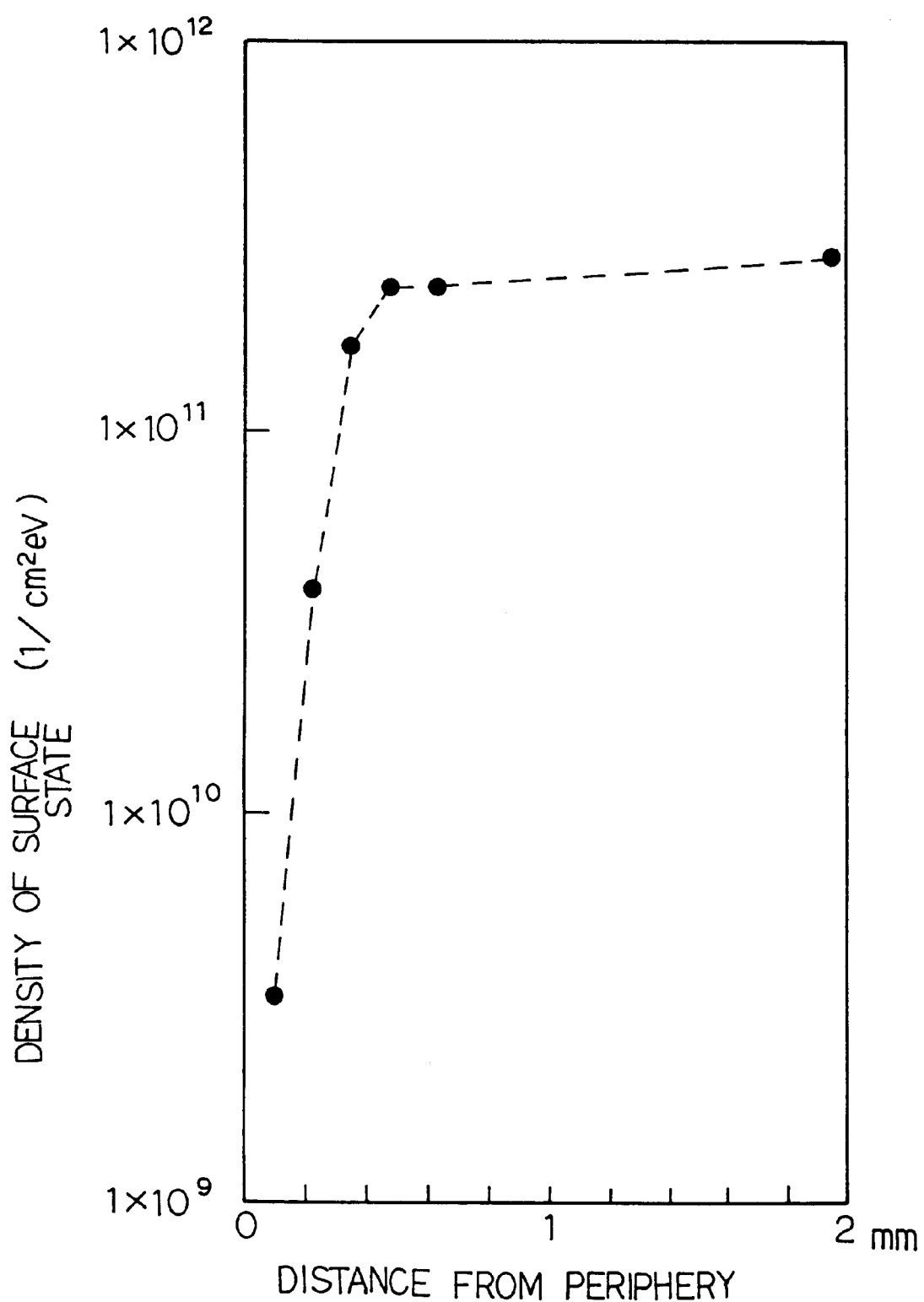
FIG. 6 is a graph showing density of surface state in terms of distance from periphery of a cell plate electrode.

As will be understood from FIG. 6, the density of surface state is saturated around the distance of 100 microns. For this reason, the slits 36 effectively reduce the density of surface state, because the slits 36 do not allow the arbitrary point P to be spaced from the hydrogen passage by more than 100 microns. Thus, the distance of 100 microns is the critical length for the reduction of surface state under the above-described annealing conditions.

Japanese Patent Publication of Unexamined Application No. 4-105359 proposes to divide a large MOS capacitor into plural small MOS capacitors. The division of the large MOS capacitor into the small MOS capacitors aims at reduction of the surface state. However, the Japanese Patent Publication of Unexamined Application is silent to the application to a semiconductor dynamic random access memory device. As described hereinbefore, even if a conductive electrode is simply divided into plural conductive sub-plates, the hydrogen reaches the boundary between the silicon and the silicon oxide within 100 microns from the gas passage such as the gap between the sub-electrodes. The Japanese Patent Publication is silent to the critical length, and does not teach the essential feature of the present invention.

Second Embodiment

FIGS. 7A to 7D and 8 illustrate another process for fabricating a semiconductor dynamic random access memory device embodying the present invention. The process starts with preparation of a p-type silicon substrate 50. A field oxide 51 is selectively grown on the major surface of the p-type silicon substrate 50, and defines active regions 52. A pair of dynamic random access memory cells is assigned to the active region 52. The active region has an upper surface shaped in an inverted T-letter configuration.

The active regions 52 are thermally oxidized, and gate insulating layers 53 are grown on channel regions of n-channel enhancement type access transistors. Phosphorous-doped polysilicon is deposited over the entire surface by using a low pressure chemical vapor deposition, and a photo-resist etching mask (not shown) is provided on the phosphorous-doped polysilicon layer. The phosphorous-doped polysilicon layer is selectively etched away by using an anisotropic dry etching, and the phosphorous-doped polysilicon layer is patterned into gate electrode lines 54.

Arsenic is ion implanted into the active regions 52, and n-type source regions 55 and n-type common drain regions 56 are formed in the active regions 52 in a self-aligned manner with the gate electrode lines 54. The n-type source regions 55 and the n-type common drain regions 56 are indicated by hatching lines in FIG. 7A.

Figure 7A:
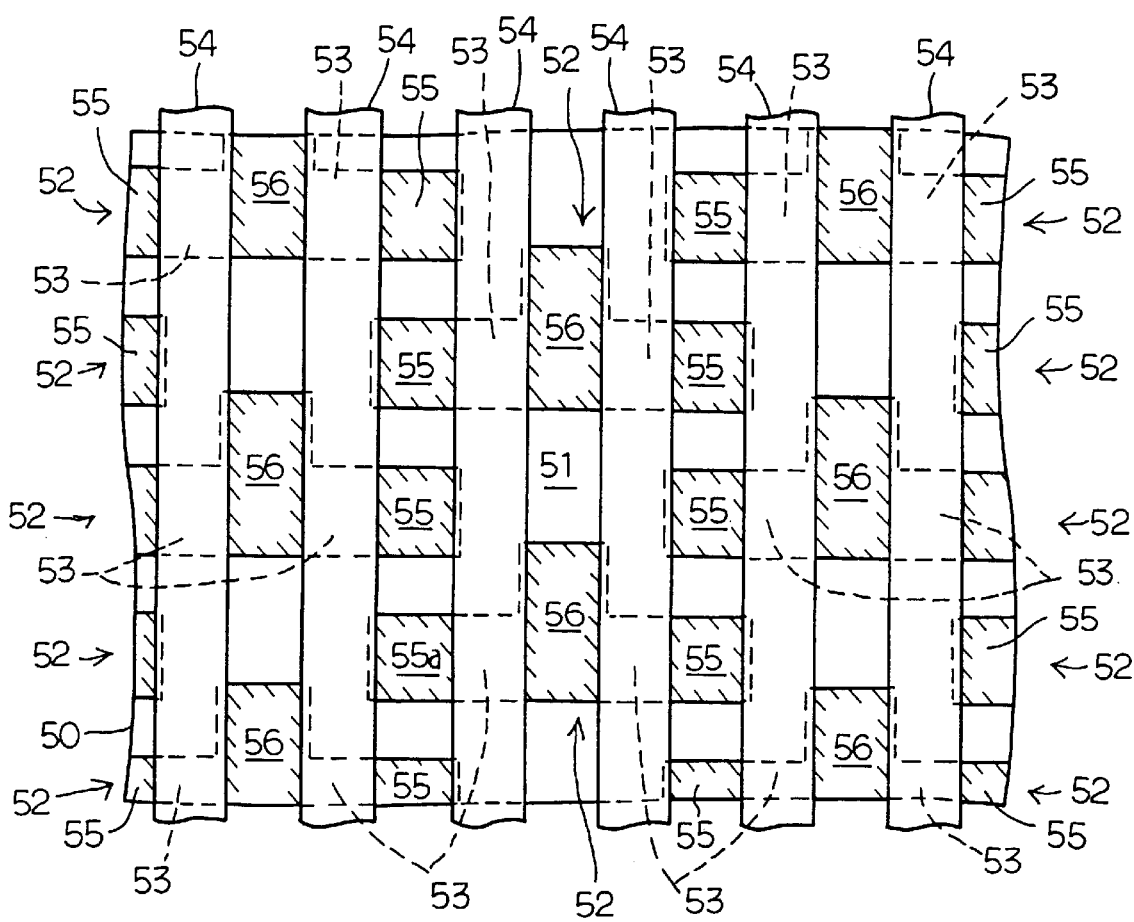
FIGS. 7A to 7D are plane views showing another process for fabricating a semiconductor dynamic random access memory device according to the present invention.
Figure 7B:
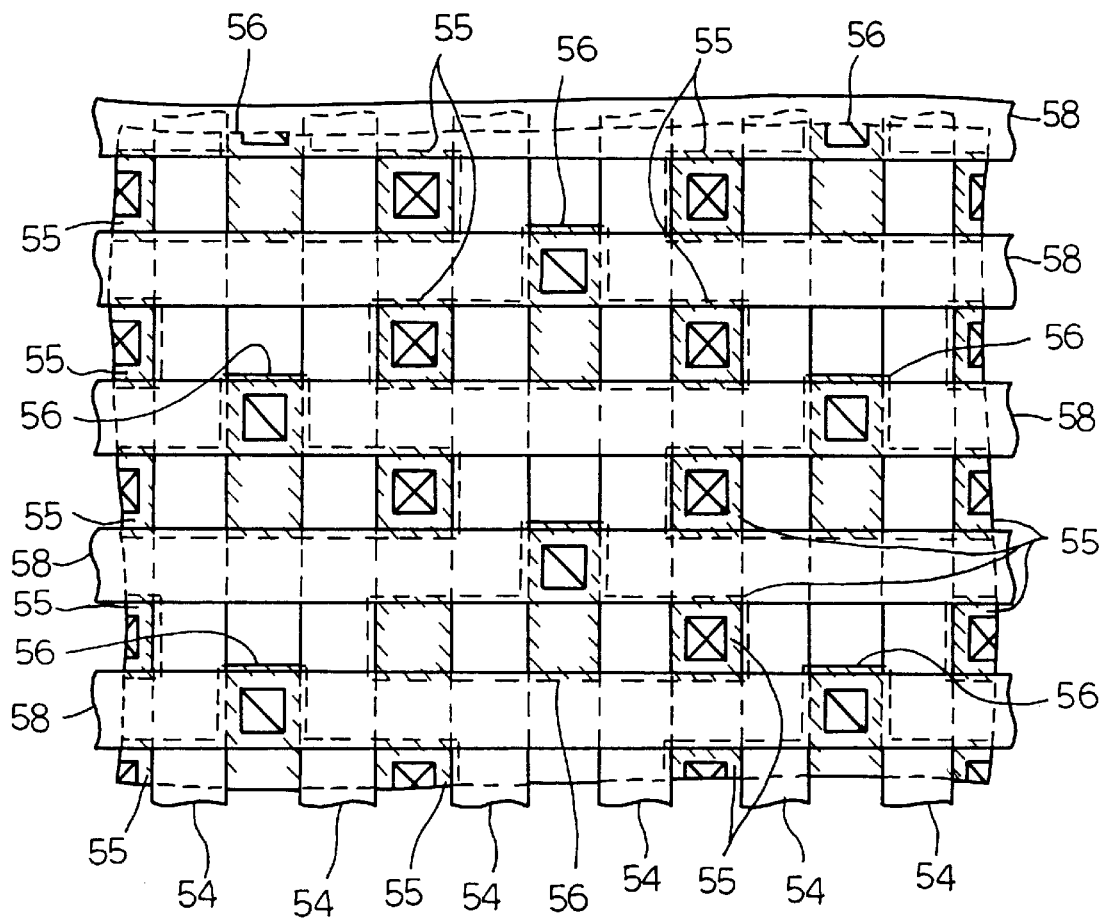
Figure 7C:
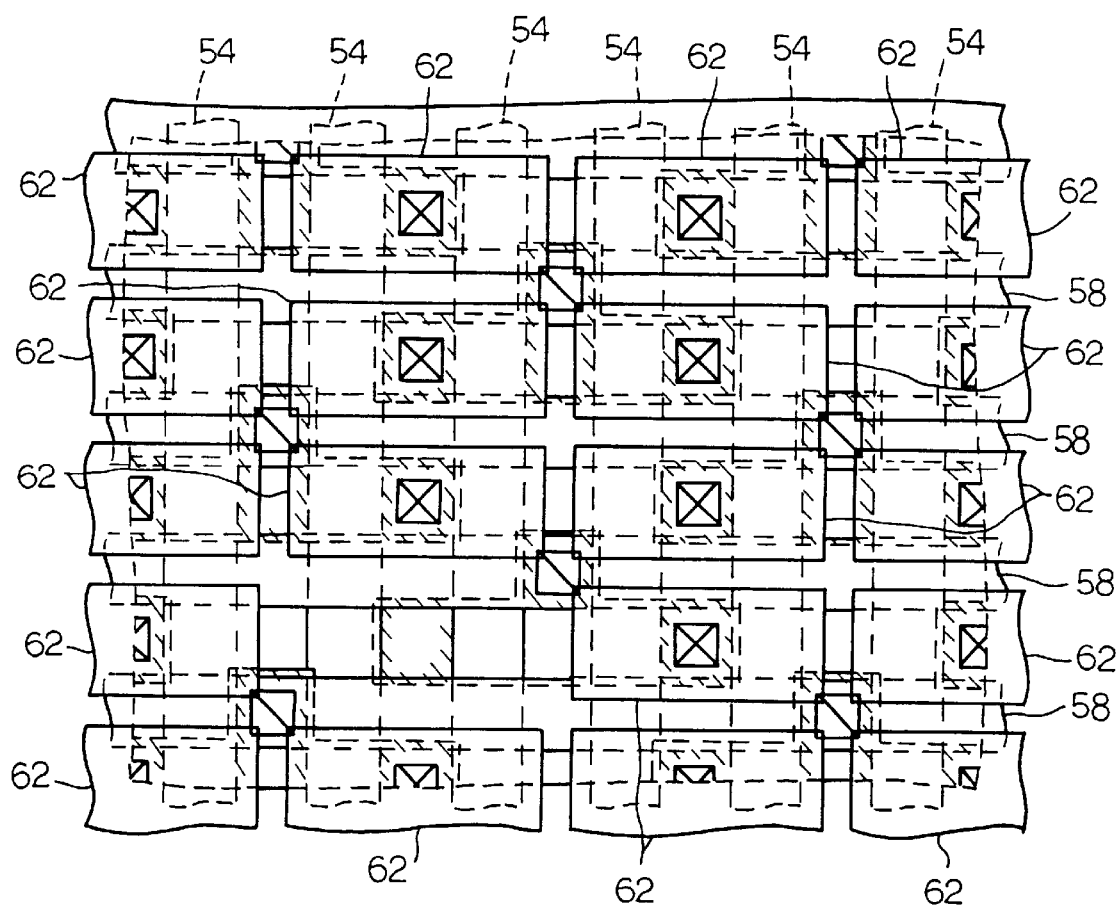
Figure 7D:
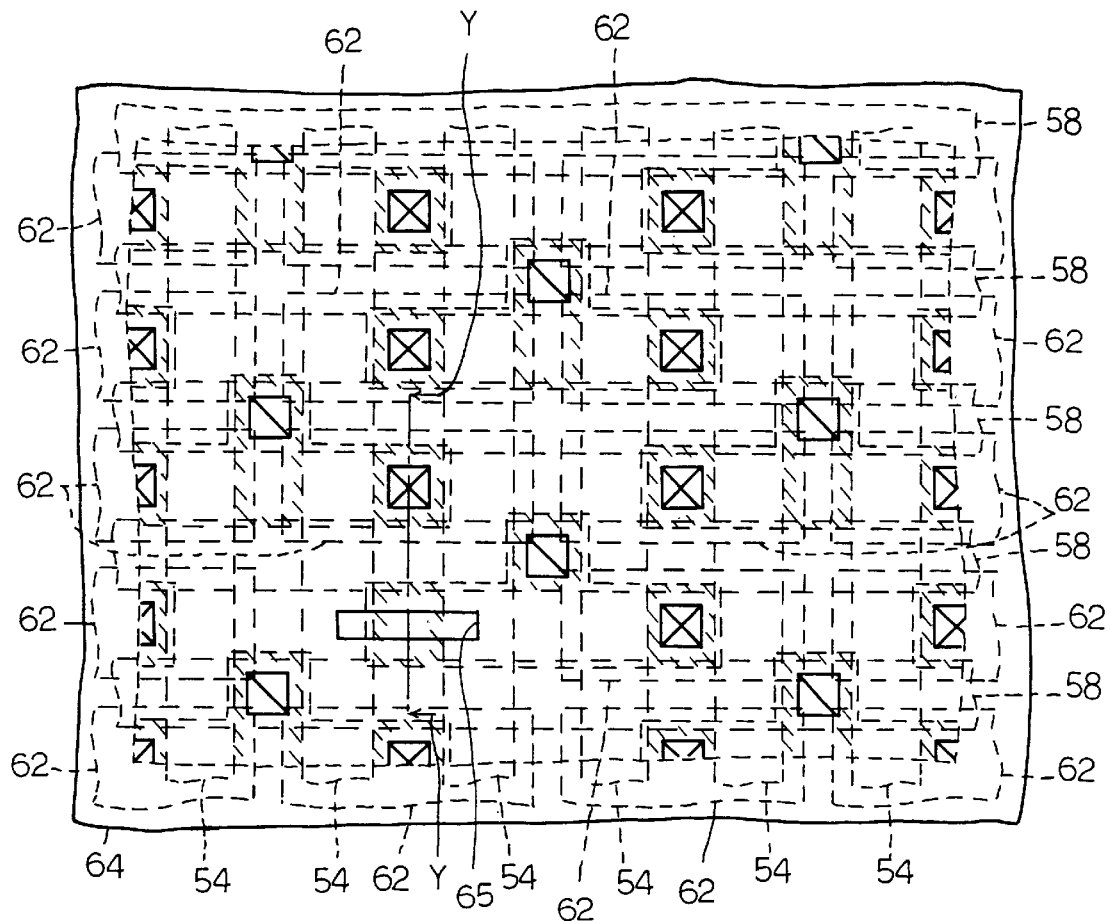
Figure 8:
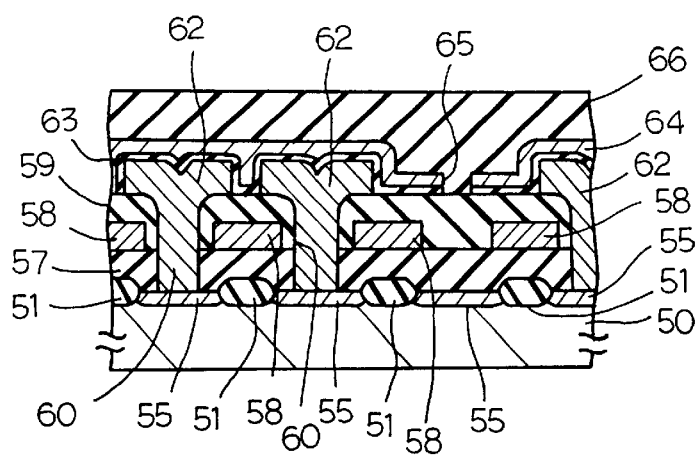
FIG. 8 is a cross sectional view showing the structure of another semiconductor dynamic random access memory device according to the present invention.

Silicon oxide is deposited to 400 nanometers thick over the entire surface of the resultant structure, and forms a first inter-level insulating layer 57 (see FIG. 8). The first inter-level insulating layer 57 is deleted from the structure shown in FIGS. 7B to 7D for the sake of simplicity.

A photo-resist etching mask (not shown) is formed on the first inter-level insulating layer 57, and the first inter-level insulating layer 57 is selectively etched away, and bit contact holes are formed in the first inter-level insulating layer 57. The n-type common drain regions 56 are exposed to the bit contact holes, and the location of each bit contact hole is indicated by square and an oblique line in FIGS. 7B to 7D. Bit lines 58 of tungsten silicide are patterned on the first inter-level insulating layer, and are held in contact with the n-type common drain regions 56 through the bit contact holes.

Silicon oxide is deposited to 400 nanometers thick over the entire surface of the resultant structure, and forms a second inter-level insulating layer 59 (see FIG. 8). The second inter-level insulating layer 59 is deleted from the structure shown in FIGS. 7B to 7D for the sake of simplicity. A photo-resist etching mask (not shown) is provided on the second inter-level insulating layer 59 through the photo-lithography, and the second inter-level insulating layer 59 and the first inter-level insulating layer 57 are selectively etched away for forming node contact holes 60 (see FIG. 8). However, any node contact hole 60 is formed in the first/second inter-level insulating layers 57/59 over selected n-type impurity regions 55a. Slits are formed over the n-type impurity regions 55a in a later stage. The location of each node contact hole 60 is indicated by mark "x" inserted in a box in FIGS. 7B to 7D.

Subsequently, storage electrodes 61 are patterned on the second inter-level insulating layers 59, and are 500 nanometers thick. The gap between the adjacent storage electrodes 61 is narrower than the minimum gap L1 as similar to that of the first embodiment. However, the storage electrode 61 is not formed over the impurity region 55a.

Subsequently, tantalum oxide $Ta_2O_5$ is deposited to 5 nanometers thick over the entire surface of the resultant semiconductor structure, and the tantalum oxide layer serves as a dielectric layer 63 for storage capacitors. Titanium nitride and tungsten silicide are successively deposited over the dielectric layer 63. A photo-resist etching mask (not shown) is prepared on the tungsten silicide layer, and the tungsten silicide layer, the titanium nitride layer and the dielectric layer 63 are selectively etched away. As a result, a cell plate electrode 64 is patterned on the dielectric layer 63, and slits 65 are formed in the cell plate electrode 64 as shown in FIG. 7D.

The slit 65 measures 0.4 micron wide and 2 microns long. The slits 65 may be formed in the cell plate electrode 64 only. The slits 65 are located over the n-type impurity regions 55a. The storage electrode 62, the dielectric layer 63 and the cell plate electrode 64 form a storage capacitor connected in series to the n-channel enhancement type access transistor.

Subsequently, boro-phospho-silicate glass is deposited to 400 nanometers thick over the storage capacitors, and forms a third inter-level insulating layer 66 as shown in FIG. 8.

A photo-resist etching mask is provided on the third inter-level insulating layer 66 through the photo-lithography, and the third inter-level insulating layer 66, the second inter-level insulating layer 59 and the first inter-level insulating layer 57 are selectively etched away so as to form word contact holes (not shown). The word contact holes are arranged at predetermined intervals, and the predetermined interval may be equivalent to 1024 bit lines. Aluminum or aluminum alloy is deposited over the entire surface of the resultant semiconductor structure, and the aluminum layer or the aluminum alloy layer is patterned into main word lines (not shown) by using the photo-lithography and an etching technique. The main word lines are selectively connected through the word contact holes to the gate electrode lines 25, and the main word lines and the gate electrode lines 54 form plural word lines.

Figure 9:
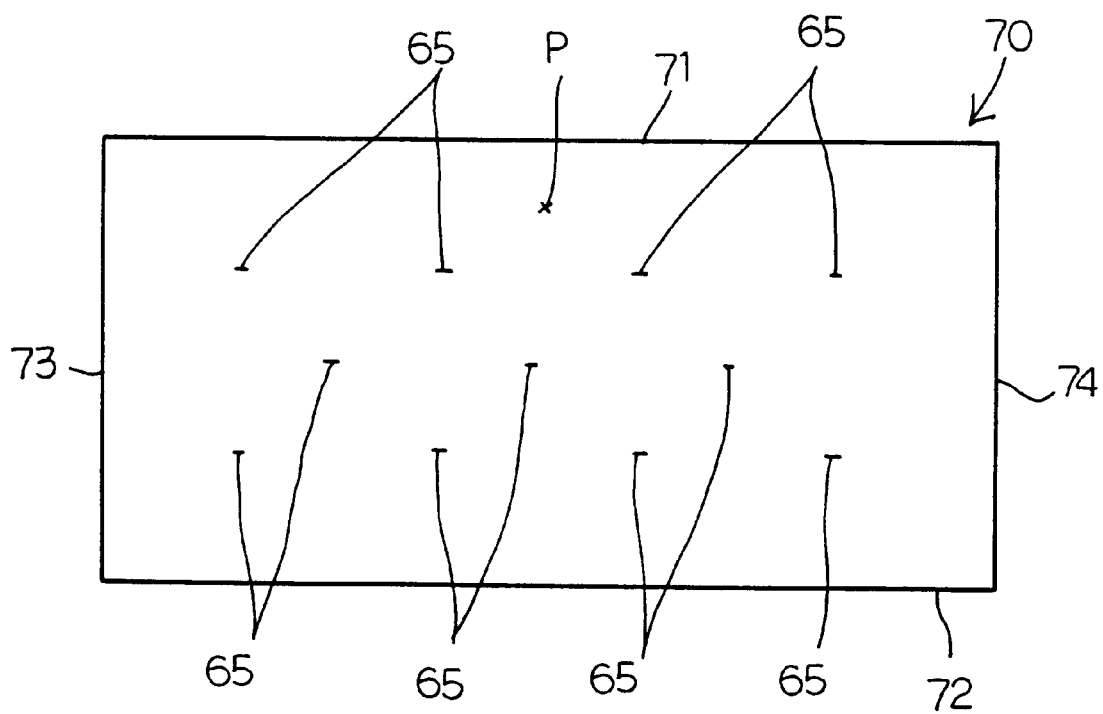
FIG. 9 is a plane view showing, a cell plate electrode equivalent to a cell plate electrode incorporated in the semiconductor dynamic random access memory device shown in FIG. 8.

The cell plate electrode 64 is equivalent to a rectangular cell plate electrode 70 shown in FIG. 9. The bit lines 58 extends in parallel to the long edges 71/72, and the slits are located over areas between the bit lines 58. The slits 65 are two-dimensionally arranged in the cell plate electrode 70, and an arbitrary point P under the rectangular cell plate electrode 70 is spaced from either edge line 71/72/73/74 or slit 65 by distance equal to or less than 100 microns. The slits 65 and the second inter-level insulating layer 59 outside of the periphery of the electrode 70 provide gas passage to a chemical species used for reduction of surface state.

The resultant semiconductor structure is placed in an annealing chamber (not shown), and gaseous mixture of inert gas and hydrogen is introduced into the annealing chamber. The hydrogen gas and the inter gas are regulated to 1:1. The annealing chamber is maintained at the atmospheric pressure, i.e., about $10^5$ Pa, and the hydrogen annealing is carried out at 400 degrees in centigrade for 30 minutes. The hydrogen enters through the slits 65 into the second inter-level insulating layer 59, and is diffused through the second interlevel insulating layer 59 and the first inter-level insulating layer 57. The hydrogen reaches the boundaries between the channel regions and the gate insulating layers 53, and are coupled to the dangling bonds of the p-type silicon crystal. As a result, the surface state is decreased.

The storage capacitor is not fabricated under the slits 65, and a memory cell array intermittently lacks the memory cell. However, the missing memory cells are replaced with redundant memory cells. Thus, the memory cell array of the second embodiment is appropriate to a semiconductor dynamic random access memory device with a redundancy.

As will be appreciated from the foregoing description, the slits provides a part of gas passage, and allows the hydrogen to reach all the boundaries where surface state takes place. As a result, the hydrogen effectively decreases the density of surface state, and makes the semiconductor dynamic random access memory device reliable. Moreover, the designer is allowed to freely determine the cell plate electrode 35/64, because the slits 36/65 provide the gas passage.

Although particular embodiments of the present invention have been shown and described, it will be apparent to those skilled in the art that various changes and modifications may be made without departing from the spirit and scope of the present invention.

The present invention is never limited to the semiconductor dynamic random access memory device of the type having storage capacitor over bit lines. The reduction of surface state is indispensable for any kind of semiconductor integrated circuit, and slits or openings are effective against an obstacle to a chemical species for reduction of surface state density.

Circuit components to be protected against the surface state is not limited to a field effect transistor. The circuit component may be a capacitor formed on the silicon substrate.

The cell plate electrode may be formed of metal or alloy. The metal and the alloy are not permeable to the hydrogen. Holes may be formed in the cell plate electrode.

The critical length from the gas passage is variable depending upon the conditions of annealing. The critical length is increased together with the annealing temperature. The paper entitled as "Limitation of Post-Metallization Annealing Due to Hydrogen Blocking Effect of Multilevel Interconnect" teaches that the diffusion length of hydrogen is short under low temperature. Of course, if the inter-level insulating layers are formed of another kind of insulating material, the critical length is affected by it. Thus, the critical length of 100 microns is not absolute. The importance is that the present inventor finds the critical length for the reduction of surface state.

What is claimed is:

1. A semiconductor integrated circuit device comprising:
   at least one circuit component having a boundary where surface states take place;
   an inter-level insulating layer covering said at least one circuit component, and formed of a first material permeable to a chemical species used for reduction of said surface states; and
   an obstacle layer formed on said inter-level insulating layer over said boundary, formed of a second material less permeable to said chemical species, and having at least one opening providing a passage to said chemical species together with an exposed surface of said inter-level insulating layer outside of an outer periphery of said obstacle and making said boundary spaced from said passage by a distance equal to or less than a critical distance measured in a direction parallel to said obstacle and determined on the basis of a diffusion length of said chemical species under predetermined diffusing conditions,
in which said first material, said second material and said chemical species are silicon oxide, polysilicon and hydrogen, and said at least one circuit component is a field effect transistor having said boundary between a channel region and a gate insulating layer.

2. The semiconductor integrated circuit device as set forth in claim 1, in which said field effect transistor serves as an access transistor of a dynamic random access memory cell, and said obstacle serves as a cell plate electrode forming a part of a storage capacitor of said dynamic random access memory cell.

3. The semiconductor integrated circuit device as set forth in claim 2, in which said cell plate electrode is shared between said storage capacitor and other storage capacitors respectively incorporated in other dynamic random access memory cells having the same structure as said dynamic random access memory cell.

4. The semiconductor integrated circuit device as set forth in claim 3, in which said inter-level insulating layer includes
   a first inter-level insulating sub-layer covering the access transistors of the dynamic random access memory cells and formed with lower portions of node contact holes and bit contact holes allowing bit lines on said first inter-level insulating sub-layer to be held in contact with drain regions of said access transistors therethrough, and
   a second inter-level insulating sub-layer laminated on said first inter-level insulating layer and formed with upper portions of said node contact holes allowing storage electrodes formed thereon to be held in contact with source regions of said access transistors through said upper portions and said lower portions of said node contact holes.

5. The semiconductor integrated circuit device as set forth in claim 4, in which a part of said second inter-level insulating sub-layer is exposed to said at least one opening.

6. The semiconductor integrated circuit device as set forth in claim 3, in which said cell plate electrode further has openings forming parts of said passage, and the boundaries of said access transistors are spaced from said passage by distances equal to or less than said critical distance.

7. The semiconductor integrated circuit device as set forth in claim 6, in which said dynamic random access memory cells are selectively assigned to active regions formed in a major surface of a semiconductor substrate and forming rows of active regions, the active regions of every other row decline toward one side of a direction of row, and the active regions of the remaining rows declines toward the other side of said direction of row, one end portion of one of said active regions of said every other row is spaced from other ends of the active regions of one of the remaining rows by a first distance and a second distance longer than said first distance, respectively, and said at least one opening and said openings are located over areas each between said one end portion and the other end portion spaced by said second distance.

8. The semiconductor integrated circuit device as set forth in claim 6, in which said dynamic random access memory cells are selectively assigned to active regions formed in a major surface of a semiconductor substrate and having respective upper areas of an inverted T-letter configuration, and said at least one opening and said openings are located over portions of selected active regions where the storage capacitors are removed.

* * * * *